United States Patent
Ku et al.

(10) Patent No.: US 7,781,322 B2
(45) Date of Patent: Aug. 24, 2010

(54) NICKEL ALLOY SALICIDE TRANSISTOR STRUCTURE AND METHOD FOR MANUFACTURING SAME

(75) Inventors: Ja-Hum Ku, Seongnam (KR); Kwan-Jong Roh, Anyang (KR); Min-Chul Sun, Suwon (KR); Min-Joo Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 697 days.

(21) Appl. No.: 10/726,638

(22) Filed: Dec. 4, 2003

(65) Prior Publication Data
US 2004/0266182 A1 Dec. 30, 2004

(30) Foreign Application Priority Data
Jun. 27, 2003 (KR) .................. 10-2003-0042838

(51) Int. Cl.
*H01L 21/3205* (2006.01)
(52) U.S. Cl. .............. 438/592; 257/E21.432
(58) Field of Classification Search ......... 438/585–595, 438/682–683; 257/E21.432
See application file for complete search history.

(56) References Cited

U.S. PATENT DOCUMENTS

| | | | |
|---|---|---|---|
| 4,141,022 A | 2/1979 | Sigg et al. | |
| 6,033,537 A | 3/2000 | Suguro | |
| 6,376,342 B1 | 4/2002 | Tseng | |
| 6,388,327 B1 | 5/2002 | Giewont et al. | |
| 6,413,859 B1 | 7/2002 | Cabral, Jr. et al. | |
| 6,498,080 B1 * | 12/2002 | Chittipeddi et al. | 438/585 |
| 6,531,396 B1 | 3/2003 | Chi et al. | |
| 6,797,614 B1 * | 9/2004 | Paton et al. | 438/655 |
| 6,846,734 B2 * | 1/2005 | Amos et al. | 438/592 |
| 2002/0045307 A1 | 4/2002 | Kittl et al. | |
| 2005/0176247 A1 * | 8/2005 | Cabral et al. | 438/682 |

FOREIGN PATENT DOCUMENTS

| | | |
|---|---|---|
| EP | 0 501 561 | 9/1992 |
| JP | 2002/124487 | 4/2002 |

(Continued)

OTHER PUBLICATIONS

Sun M C et al., "Thermally Robust Ta-Doped Ni Salicide Process Promising for sub-50nm CMOSFETs", *Digest of Technical Papers*, New York, NY, Jun. 10, 2003, pp. 81-82.

(Continued)

*Primary Examiner*—Richard A. Booth
(74) *Attorney, Agent, or Firm*—Harness, Dickey & Pierce, P.L.C.

(57) ABSTRACT

Provided are exemplary methods for forming a nickel silicide layer and semiconductor devices incorporating a nickel silicide layer that provides increased stability for subsequent processing at temperatures above 450° C. In particular, the nickel silicide layer is formed from a nickel alloy having a minor portion of an alloying metal, such as tantalum, and exhibits reduced agglomeration and retarded the phase transition between NiSi and NiSi$_2$ to suppress increases in the sheet resistance and improve the utility for use with fine patterns. As formed, the nickel silicide layer includes both a lower layer consisting primarily of nickel and silicon and a thinner upper layer that incorporates the majority of the alloying metal.

34 Claims, 10 Drawing Sheets

FOREIGN PATENT DOCUMENTS

| | | |
|---|---|---|
| JP | 2003/168652 | 6/2003 |
| KR | 1999-0078553 | 11/1999 |
| KR | 10-2000-0045854 | 7/2000 |
| KR | 10-2001-0037851 | 5/2001 |
| KR | 10-2001-0045773 | 6/2001 |
| KR | 10-2002-0088056 | 11/2002 |
| WO | WO 02/65524 | 8/2002 |

OTHER PUBLICATIONS

Office Action issued May 30, 2008 in corresponding Korean Application No. 10-2003-0032838.

Decision of Grant issued Aug. 26, 2008 in corresponding Korean Patent Application No. 10-2003-0042838.

* cited by examiner

NICKEL ALLOY SALICIDE TRANSISTOR STRUCTURE AND METHOD FOR MANUFACTURING SAME

CROSS REFERENCE TO RELATED APPLICATION

This application claims priority under 35 U.S.C. § 119 from Korean Patent Application No. 2003-42838, filed on Jun. 27, 2003, in the Korean Intellectual Property Office, the disclosure of which is hereby incorporated by reference in its entirety.

BACKGROUND OF THE INVENTION

1. Field of the Invention

The present invention relates to an improved structure and method for fabricating semiconductor devices and, more particularly, an improved structure and method for forming nickel salicide structures during semiconductor device manufacturing processes using a nickel alloy to form the salicide layer.

2. Description of the Related Art

As the integration density of semiconductor devices continues to increase and the critical dimensions associated with such devices continue to decrease, there has been a corresponding increase in interest in identifying materials and processes for producing interest in low resistance materials to maintain or reduce signal delay. Silica and salicide (self-aligned silicide) materials and processes have been widely used to lower the sheet resistance and contact resistance for the gate conductor and source/drain regions of MOS devices.

A number of metals, including tungsten, tantalum, zirconium, titanium, hafnium, platinum, palladium, vanadium, niobium, cobalt, nickel and various alloys of such metals have been used to form silicide layers on semiconductor devices. For gate lengths below about 100 nm, however, conventional salicide processes and materials tend to experience a variety of difficulties including opens, residues and layer non-uniformity, resulting at least in part from agglomeration within the silicide material layer.

These difficulties tend to be exacerbated by the high-temperature processing required to react most metal(s) with silicon to form the desired silicide layers. The high temperature anneals required also raise concerns regarding the impact of the silicide annealing process(es) on the thermal budget for the devices being manufactured. For example, when cobalt is used to form the silicide, the initial stoichiometry of the silicide may be generally represented as CoSi, but as the annealing process continues, particularly at higher temperatures, the silicide tends to incorporate an increasing amount of silicon and approaches a composition more closely represented as $CoSi_2$. For devices having gate lengths below about 100 nm, however, the second high temperature silicidation used in conventional Co salicide processes tends to induce agglomeration within the silicide material layer, increasing the degree of non-uniformity within the layer and tending to degrade the performance of the resulting devices.

Nickel is an attractive metal for forming silicides because the annealing process required to form the desired silicide may be conducted at a relatively low temperature, e.g., below about 550° C. Depending on the reaction conditions, nickel can react with silicon to form dinickel monosilicide, $Ni_2Si$, nickel silicide, NiSi, or nickel disilicide, $NiSi_2$, as the silicidation product. Using annealing temperatures greater than about 550° C. tends to increase the formation of the most resistive nickel-disilicide $NiSi_2$ and a corresponding increase in the silicon consumption and are, therefore, generally avoided. Nickel silicide, NiSi, however, can be preferentially formed at lower temperatures and provides the lowest sheet resistance of the three nickel silicide phases. Due to the low silicidation temperature, NiSi exhibits a decreased tendency to agglomerate and form a silicide layer in which the sheet resistance is generally independent of the device dimensions, increasing its utility for lowering the resistance of fine line structures.

BRIEF SUMMARY OF THE INVENTION

Embodiments of the present invention provide methods of forming a nickel silicide layer by the reaction between a nickel alloy and an exposed silicon surface comprising depositing a nickel alloy layer on the exposed silicon surface, the nickel alloy including nickel and an alloying metal, reacting the nickel alloy layer with the exposed silicon surface to form a nickel silicide layer having an upper layer and a lower layer, wherein the alloying metal is preferentially segregated into the upper layer.

As a result of this segregation, the lower layer and the upper layer of the silicide layer will have different compositions and different thicknesses. The lower layer, for instance tends to be the thicker of the two layers and will typically include at least about 95 atomic percent nickel and silicon, with the nickel and silicon being present in an atomic ratio of about 1 and present primarily as NiSi with, at most, only minor amounts of $NiSi_2$.

Conversely, the upper layer tends to be the thinner of the two layers and to incorporate the majority of the alloying metal, such as tantalum. Depending on the initial concentration of the alloying metal in the nickel alloy, the final concentration of nickel and silicon in the upper layer can vary widely including, for example, between about 2 and about 90 atomic percent, and be present in atomic ratios between about 1:1 and about 2:1.

Exemplary methods of forming the silicide layers may include forming a capping layer of a material such as titanium nitride, TiN, and particularly a nitrogen-rich TiN layer, i.e., a N:Ti atomic ratio of at least about 0.5 and as high as about 2, on the nickel alloy layer prior to forming the silicide. The alloying metal selected should exhibit both a diffusivity and a solubility in silicon that are lower than the corresponding values for nickel. The alloying metal should also exhibit a silicidation temperature in excess of that necessary to form nickel silicide.

Tantalum has been identified as an alloying metal that possesses this combination of properties and appears to be useful for forming silicides according to the exemplary embodiments of the invention at concentrations of up to at least about 10 atomic percent, with levels in the range of between about 0.1 atomic percent and about 5 atomic percent, and particularly about 3.5 atomic percent exhibiting acceptable performance.

Depending on the particular process flow used to prepare the substrate prior to the deposition of the nickel alloy layer, nickel silicides according to the exemplary embodiments of the invention may be formed only on the gate electrode structure, only on the surface of active regions, e.g., the source/drain regions of MOS transistors, or on both the gate electrode and the active regions.

In those instances in which the nickel silicide will not be formed on the gate electrode, the gate electrode structure will typically include one or more capping layers to protect a polysilicon layer provided above the gate dielectric layer. In those instances in which the nickel silicide will be limited to the gate electrode, a sequence of insulator deposition, typically one or more layers of a chemical vapor deposition (CVD) oxide, can be formed on the substrate. The upper portion of the insulator(s) may then be removed using, for example, a chemical-mechanical polishing or etchback process, to expose an upper silicon surface on the gate electrode structure while protecting the active regions from exposure to the nickel alloy.

In each instance, a layer of a nickel alloy will be deposited on a substrate having regions with exposed silicon and/or polysilicon surfaces, typically followed by the deposition of an optional capping layer such as TiN. A heat treatment, typically at a temperature of at least 250° C., will be used to react the nickel alloy with the exposed silicon surfaces to form the desired silicide. The capping layer and the unreacted nickel alloy may then be removed to prepare the substrate for additional processing.

The alloying metal used in conjunction with the primary nickel component may be selected from a group consisting of tantalum, vanadium, zirconium, hafnium, tungsten, cobalt, platinum, chromium, palladium, niobium and combinations thereof, but will generally constitute no more than about 10 atomic percent of the nickel alloy.

The nickel silicide formation will typically include heating the nickel alloy in contact with a silicon surface to a temperature above about 200° C. and below about 700° C., more typically between about 250° C. and about 500° C., for a period of at least about 10 seconds and possibly 30 minutes or longer. The particular time and temperature combination selected should be sufficient to produce the two-layered nickel silicide structure described above in which the majority of the nickel is present in the lower layer as NiSi and the majority of the alloying metal has been segregated into the upper layer.

Although the nickel silicides prepared according to the exemplary embodiments of the present invention tend to exhibit higher thermal stability, particularly at temperatures above about 600° C., than nickel silicides prepared from unalloyed nickel, the thermal activity of subsequent processes should generally be selected to maintain the majority, typically at least 90%, of the initial NiSi phase, i.e., suppress conversion of NiSi to $NiSi_2$, in the final semiconductor device.

Nickel silicides prepared according to the exemplary embodiments of the present invention exhibit performance improvements over both nickel silicides prepared from unalloyed nickel and more conventional cobalt silicides, particularly for devices incorporating gate structures below 100 nm and more particularly for devices incorporating gate structures below 50 nm. In particular, nickel silicides according to the present invention tend to exhibit lower and more stable sheet resistance, both upon formation and particularly after additional thermal processing.

Similarly, devices incorporating nickel silicides according to the exemplary embodiments tend to exhibit improved threshold voltages $V_{th}$, reduced diode leakage currents, improved off-current $I_{doff}$ and saturation current $I_{dsat}$ performance over the performance provided by identical devices incorporating cobalt silicides, particularly in PMOS devices. The addition of a high tensile tension capping layer such as, for example, a SiON layer, particularly on NMOS transistors that incorporate the exemplary nickel silicides according to the invention can further improve NMOS device performance.

BRIEF DESCRIPTION OF THE DRAWINGS

Exemplary embodiments of the devices and methods that may be utilized to practice the present invention are addressed more fully below with reference to the attached drawings in which.

DETAILED DESCRIPTION OF THE INVENTION

Figure 1:
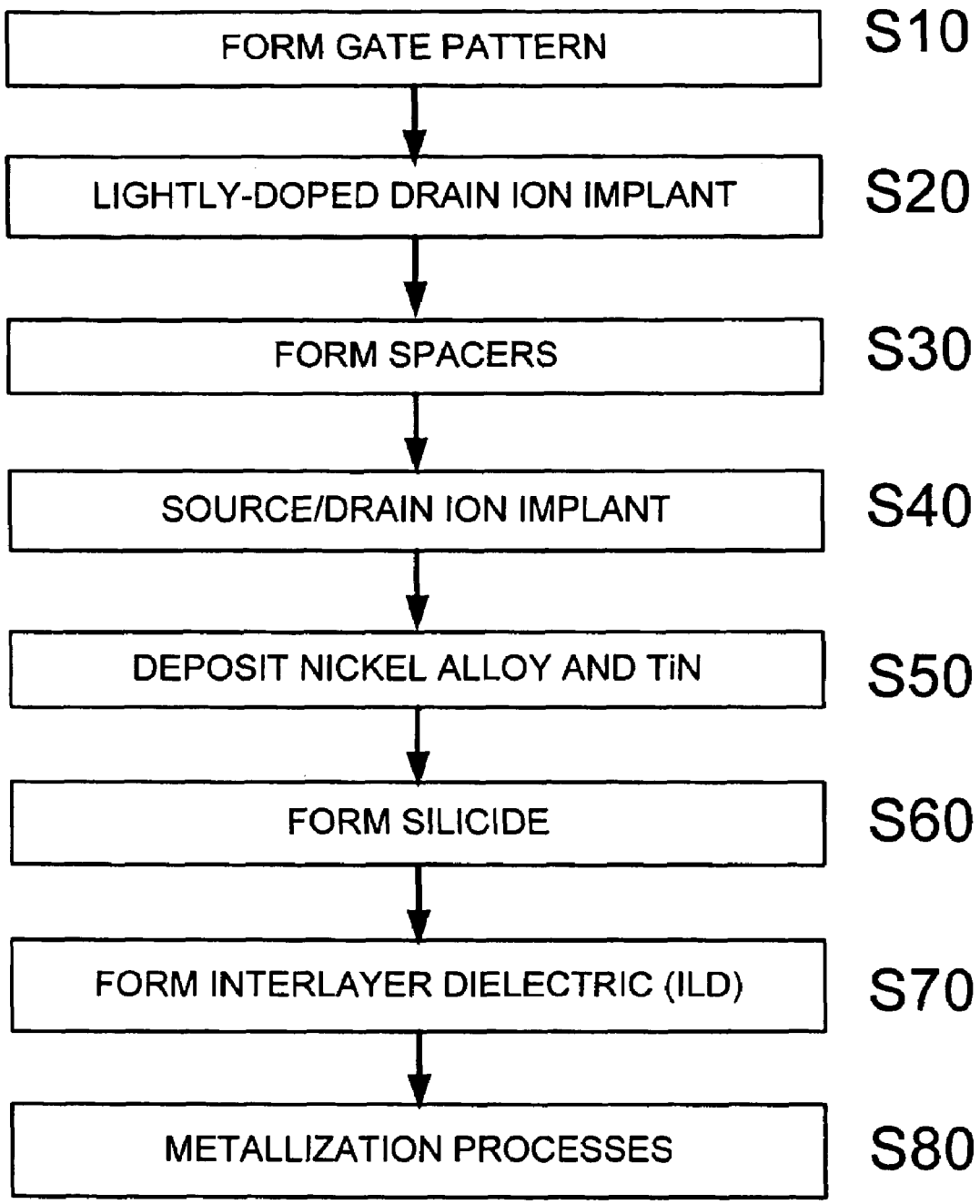
FIG. 1 illustrates certain of the process steps in an exemplary method for manufacturing semiconductor devices incorporating a nickel-alloy salicide structure in the gate region.

As illustrated in FIG. 1, an exemplary method of forming a semiconductor device according to the present invention will include the steps of forming a gate pattern, S10, forming a lightly-doped drain (LDD) using the gate pattern as the implant mask. S20, forming spacer structures adjacent the sidewalls of the gate pattern, S30, forming the source/drain regions using the gate pattern and the spacer structures as the implant mask, S40, sequentially depositing a nickel alloy and a titanium nitride layer, S50, performing a thermal silicidation process to cause the nickel alloy to form a silicide, S60, forming an interlayer dielectric (ILD), S70, and competing the metallization process to connect the discrete devices formed on the substrate, S80.

Figure 2A:
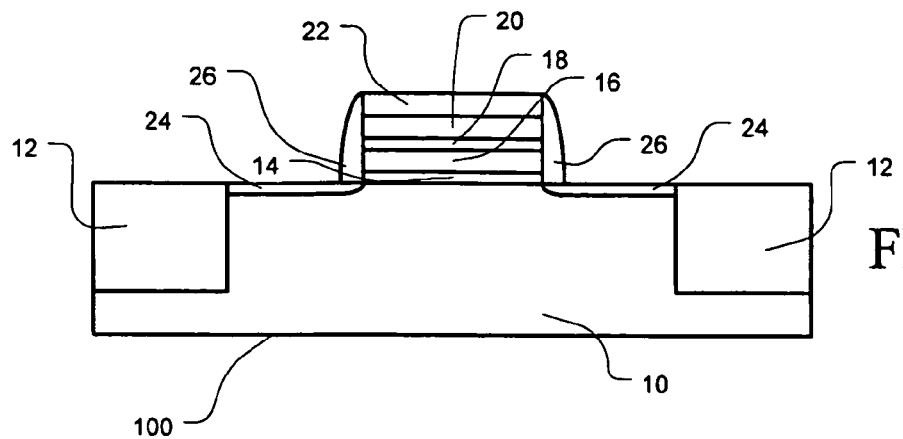
FIGS. 2A–2G illustrate selected steps in the manufacture of semiconductor devices incorporating a nickel-alloy salicide structure.

As illustrated in FIG. 2A, a semiconductor device may be formed in a substrate 10 on which or into which isolation regions 12 are formed to define an active region using a conventional shallow-trench isolation (STI) process. As illustrated, a gate structure including a gate insulator layer 14, a first conductor layer 16, such as doped polysilicon, a barrier layer 18, such as tungsten nitride, a second conductor layer 20, such as tungsten, and, optionally, a capping layer 22, may be formed in the active region. Using the gate structure as an implant mask, a first ion implant process may be used to form a lightly doped region 24, such as a lightly-doped drain (LDD), near the surface of the exposed regions of the active region.

Figure 2B:
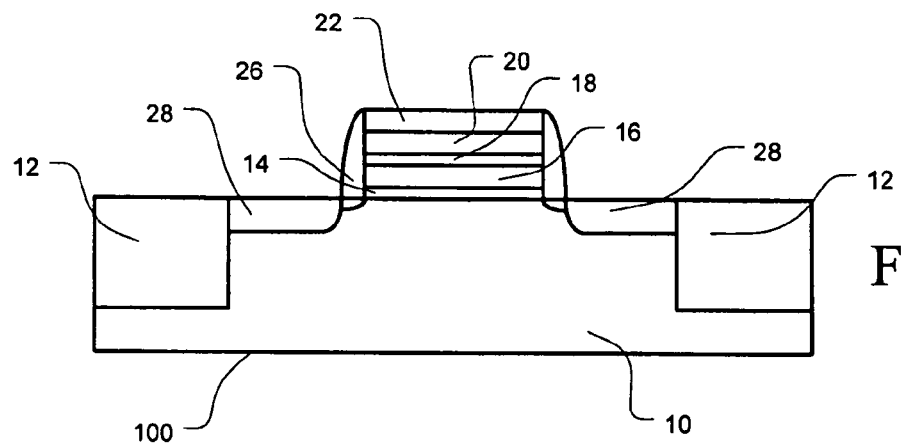

As illustrated in FIG. 2B, sidewall structures 26 may then be formed adjacent the vertical surfaces of the gate structure using a conventional deposition and etchback process. Using the gate and sidewall structures 26 as an implant mask, a second ion implant may be used to deposit a heavier concentration of dopant 28 into the exposed regions of the active region to complete the formation of the device source/drain regions.

Figure 2C:
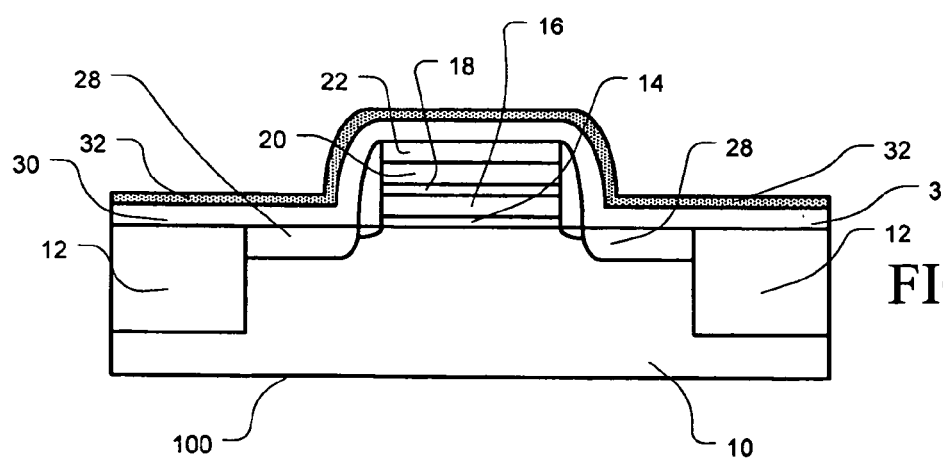

As illustrated in FIG. 2C, a layer of a nickel alloy 30 and a capping layer 32, such as titanium nitride, may be formed over the gate structure, source/drain regions and isolation regions. The device may then be annealed at a temperature, typically above 450° C., and for a time period sufficient to cause the nickel alloy layer 30 to react with the silicon of the active region to form silicide using, for example a rapid thermal anneal (RTP) process. Because the formation of the silicide is largely confined to those regions in which a silicon surface was exposed prior to the deposition of the nickel alloy 30, the silicide formation will be considered a self-aligned silicide (salicide).

Figure 2D:
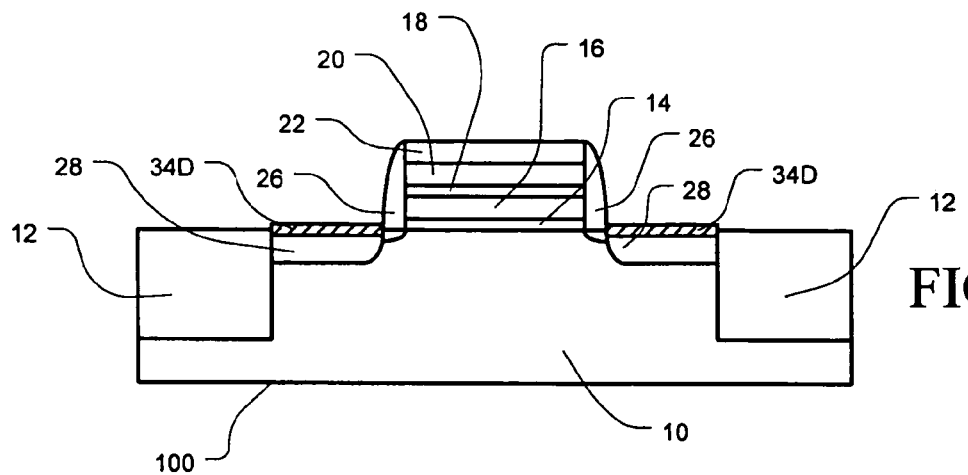
Figure 2E:
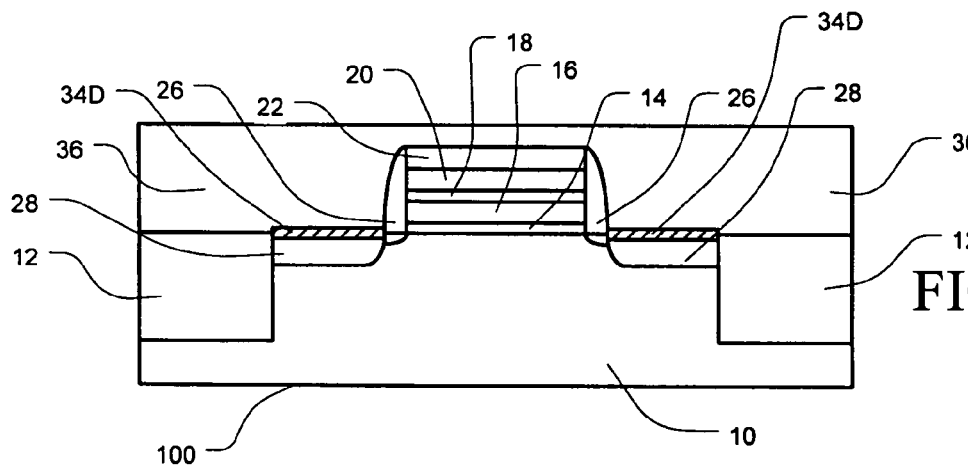

As illustrated in FIG. 2D, the capping layer 32 and the unreacted portion of the nickel alloy layer 30 may be removed using, for example, a solution including sulfuric acid, $H_2SO_4$, and hydrogen peroxide, $H_2O_2$, leaving the silicide regions 34D on the surface of the source/drain regions within the active region. As illustrated in FIG. 2E, an interlayer dielectric layer (ILD) 36 may be formed over the substrate. Although illustrated as a single layer, those of ordinary skill in the art will appreciate that the ILD 36 may include more than one layer, more than one material and may be subjected to additional processing such as chemical-mechanical polishing or etchback processing to improve the planarity of the resulting surface.

Figure 2F:
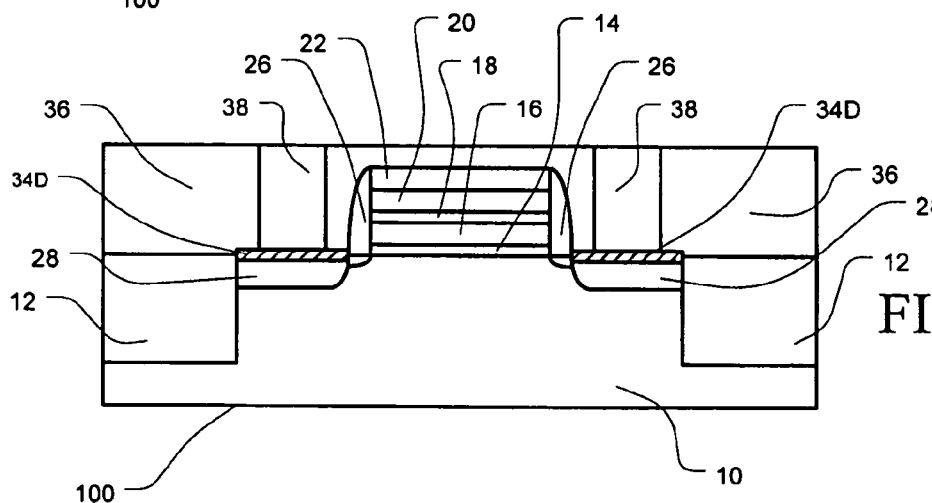
Figure 2G:
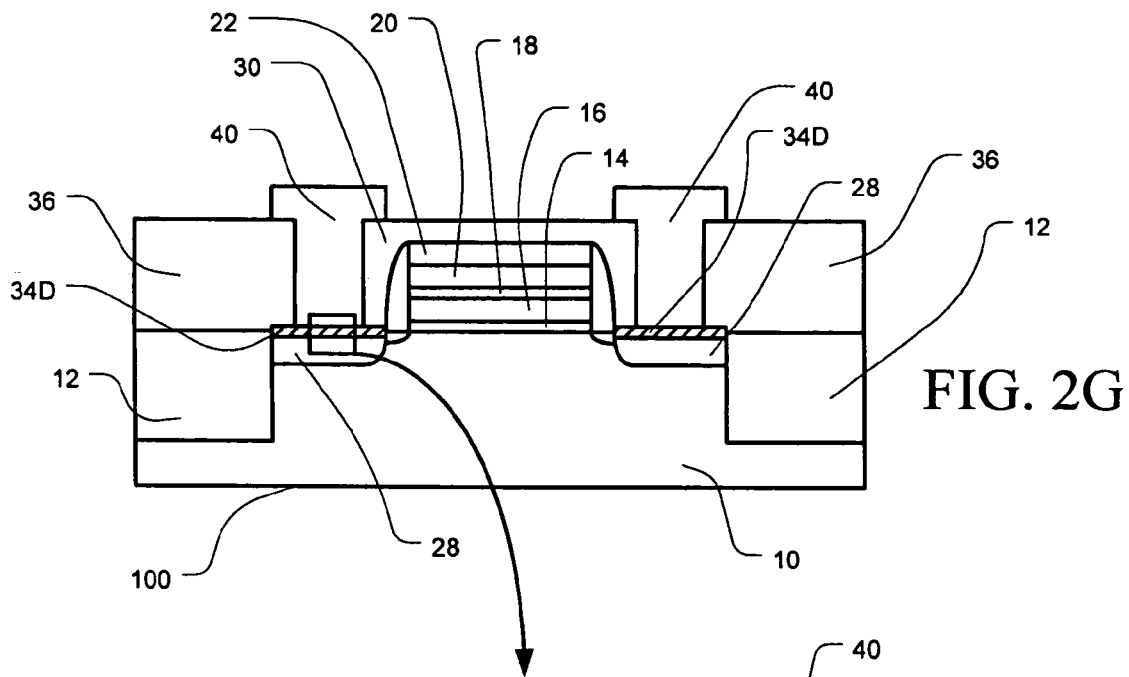

As illustrated in FIG. 2F, contact openings 38 may then be formed in the ILD 36 to expose surface regions of the source/drain regions and the gate structure. As illustrated in FIG. 2G, a variety of metallization processes and materials may then be used to form metal patterns 40 for connecting the individual transistors to the remainder of the device circuitry.

Figure 4:
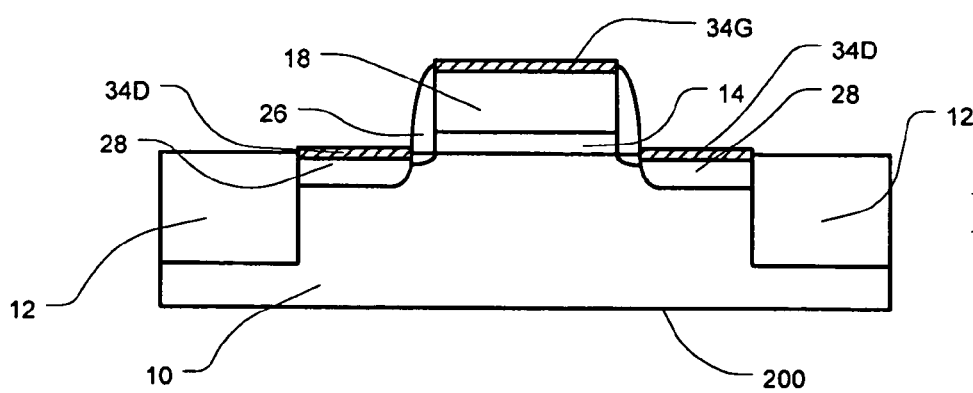
FIG. 4 illustrates an embodiment of the invention in which silicide is formed on both the source/drain regions and the gate electrode.

As illustrated in FIG. 4, if the composition of the gate structure is such that a silicon surface is exposed during the deposition of the nickel alloy layer, silicide may be formed at the upper surfaces of both the source drain regions and the gate electrode. In this instance, the first conductor layer 18 is a doped polysilicon layer and the additional barrier, second conductor and capping layers illustrated in FIGS. 2A–2G have been omitted. As a result, a silicide region 34G may be formed on the upper surface of the first conductor layer 18 in conjunction with the silicide regions 34D formed on the upper surface of the source/drain regions as described in connection with FIGS. 2D–2E.

Figure 5A:
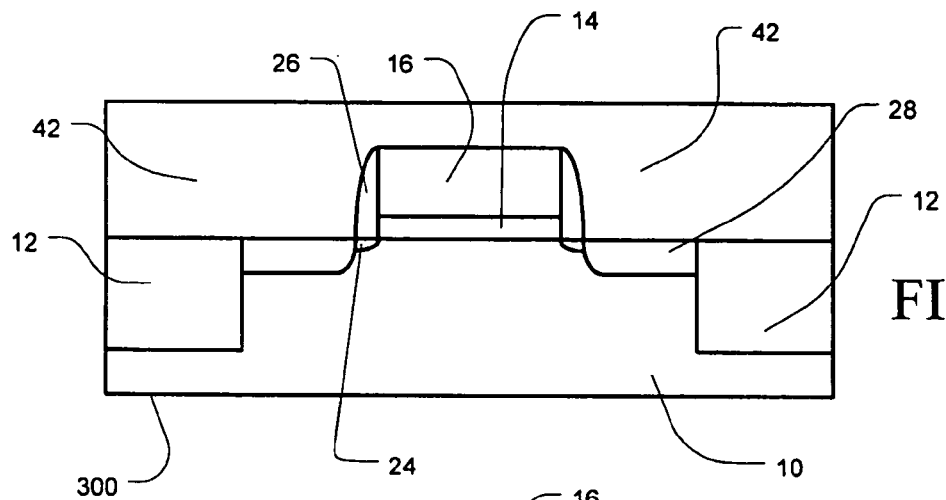
FIGS. 5A–5C illustrate an embodiment of the invention in which the silicide is limited to the gate electrode structure.
Figure 5B:
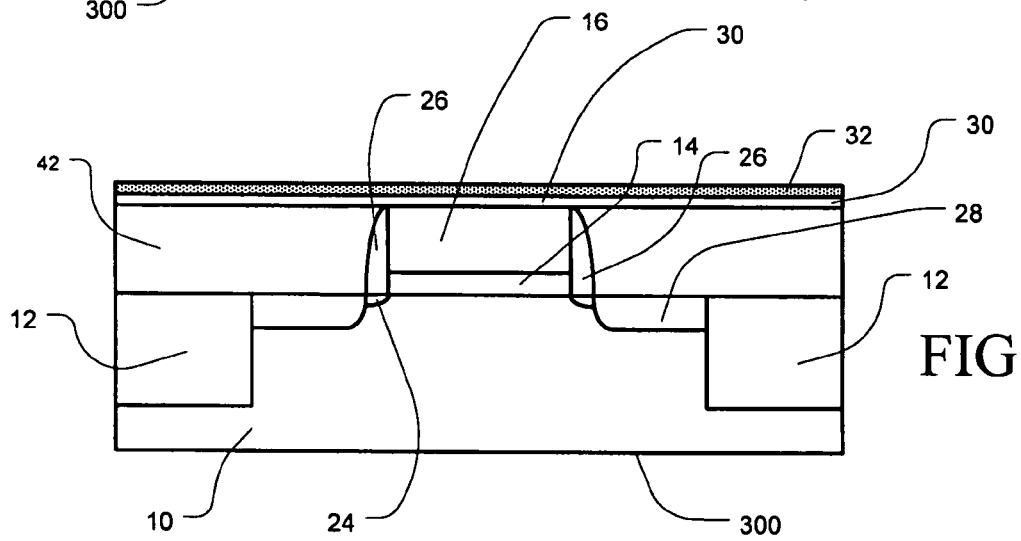
Figure 5C:
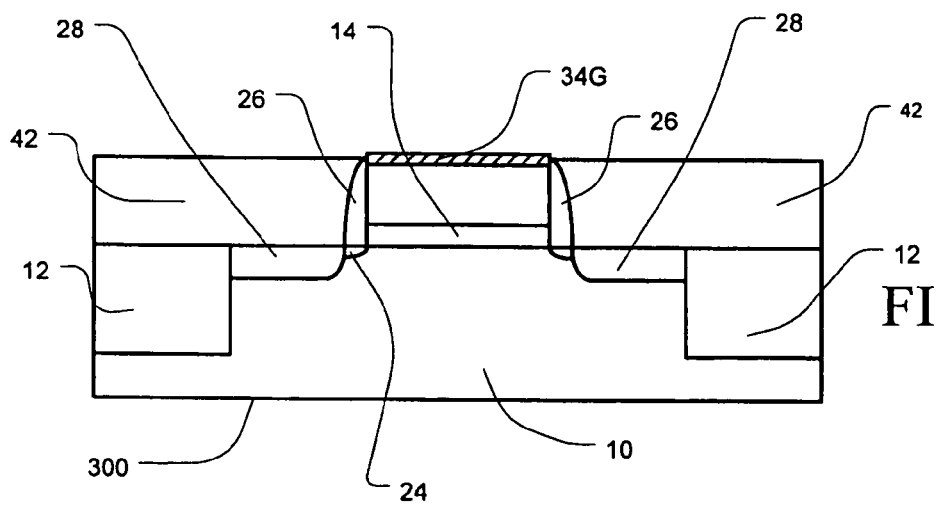

As illustrated in FIGS. 5A–5C, the exemplary process described above may be modified in order to limit silicide formation to the gate electrode. As illustrated in FIG. 5A, after defining and active region, forming the gate structure and doping the source/drain regions, an insulating layer 42 may be formed on the substrate. As illustrated in FIG. 5B, an upper portion of the insulating layer may be removed to expose an upper surface of the gate structure. As discussed above with regard to FIG. 2C, a layer of a nickel alloy 30 and a capping layer 32, such as titanium nitride, may be formed over the gate structure and the upper surface of the insulating layer 42.

If a capping layer 32 of TiN is utilized, it is preferred that the N:Ti atomic ratio within the capping layer be at least about 0.5 and up to about 2.0. A TiN capping layer may be prepared by reacting a nitrogen source gas and a titanium source gas in a reactor at a temperature of between about 25° C. and about 500° C. The N:Ti ratio may be adjusted by controlling the relative flow rates of the source gases.

The device may then be annealed at a temperature and for a time period sufficient to cause the nickel alloy layer 30 to react with the silicon on the upper surface of the gate structure to react with the nickel alloy 30 to form a silicide region 34G that is generally confined to the upper surface of the gate structure as illustrated in FIG. 5C. An interlayer dielectric layer can then be formed, with or without removing the remaining portion of insulating layer 42. Contact openings and metal patterns may then be formed using a wide variety of deposition, etch and metallization processes and materials to provide the electrical connections to the transistor necessary to produce a functional device.

As noted above, nickel has previously been used for forming silicides to take advantage of the relatively low temperature, less than about 500° C., required for silicide formation. When nickel silicides are prepared from unalloyed nickel, however, the preferred nickel silicide, NiSi, tends to be converted to the more resistive nickel disilicide, $NiSi_2$, if the silicide is exposed to high temperatures in subsequent processing or if the duration of the silicidation anneal is prolonged or higher temperatures are used for silicide formation. The use of such nickel silicides was, therefore, limited to a relatively narrow process window.

The inventors have discovered, however, that alloying nickel with a minor portion of a metal having a lower diffusivity and solubility in silicon than the primary nickel component of the alloy can provide an increased process window and a silicide layer having improved thermal stability and lower resistivity. In particular, tantalum has proven useful in preparing such nickel alloys for the formation of improved silicide layers. Further, because tantalum has a higher silicide formation temperature than nickel, it is believed that the inclusion of tantalum in the nickel silicide will not result in any adverse effects on characteristics of the devices incorporating such silicides.

A variety of metals may be used to form silicides during the production of semiconductor devices including, among others, cobalt, nickel, titanium and tantalum. Depending on the silicide formation conditions, the silicide compositions resulting from the reaction of these metals with silicon can exhibit a range of primary stoichiometries, more than one of which may be found in a silicide layer. Representative silicide compositions and the approximate formation conditions that will tend to produce the indicated composition are provided below in Table 2:

TABLE 1

| Metal | Diffusivity in Silicon $D_0$ cm$^2$/sec | Silicide Composition | Approximate Formation Temperature (° C.) | Silicide Melting Point (° C.) |
| --- | --- | --- | --- | --- |
| Cobalt (Co) m.p. 1495° C. | $9.2 * 10^{-4}$ | Co$_2$Si CoSi CoSi$_2$ | 350 350 550 | 1330 1460 1326 |
| Nickel (Ni) m.p. 1453° C. | $2 * 10^{-3}$ | Ni$_2$Si NiSi NiSi$_2$ | 200–325 400 >700 | 1318 992 981 |
| Titanium (Ti) m.p. 1661° C. | $2 * 10^{-5}$ | TiSi TiSi$_2$ | 500 600–700 | 1570 1500 |
| Tantalum (Ta) m.p. 2997° C. | $10^{-12}$–$10^{-13}$ | TaSi$_2$ | 650–800 | 2100–2300 |

The addition of minor amounts of refractory metals to other metals that form silicides may increase the thermal stability of the resulting silicides, such as NiSi. However, to minimize any adverse effect on device characteristics, it is preferred to use an additive metal or metals that exhibit a higher silicidation temperature, a lower diffusivity, and a lower solubility in Si. As noted above in Table 1, the formation of silicides using titanium or tantalum tends to occur at relatively higher temperatures and both titanium and tantalum exhibits a similar solubility of about 1 atomic percent in silicon. However, because Ta also tends to exhibit a lower value of diffusivity than Ti, Ta will tend to provide a wider process window for enabling improvement in the thermal stability of the primary NiSi silicide while reducing the likelihood of any adverse effect on device characteristics.

Figure 6:
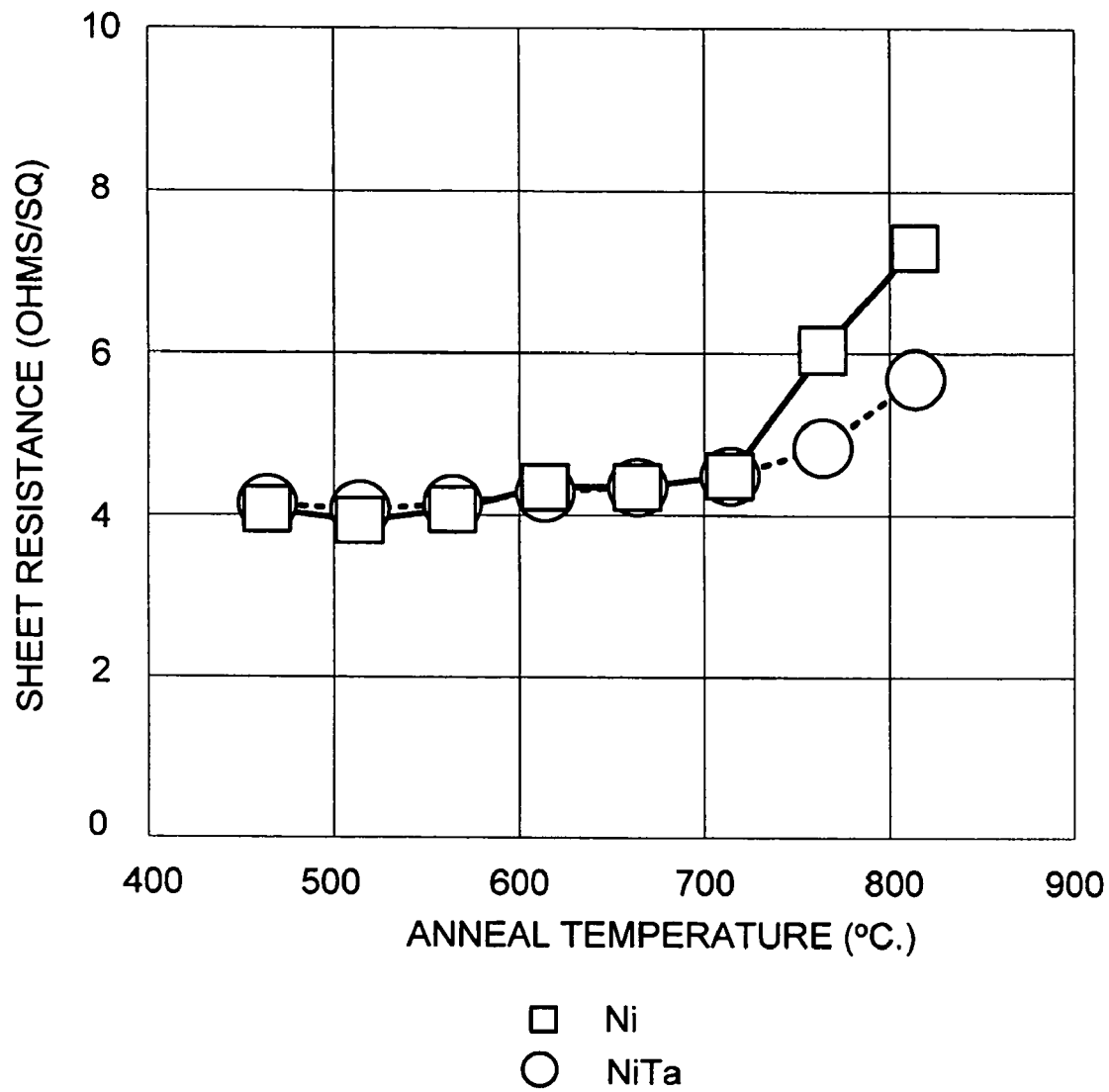
FIG. 6 is a graph illustrating the sheet resistance of the resulting silicide layer as a function of the metal layer composition and the annealing temperature.

Tests were conducted to evaluate the impact of the tantalum on the process window for the formation of silicides from metal layers of Ni and NiTa (3.5 atomic percent Ta) films deposited on single crystal silicon. After sputter deposition of the metal films, the test wafers were annealed for 30 seconds using a range of annealing temperatures. As reflected in the data presented in FIG. 6, the silicide films prepared from the NiTa alloy exhibited a slower rate of increase in the sheet resistance of the silicide layer than those prepared from Ni alone, suggesting that the tantalum retards the phase transition from NiSi to NiSi$_2$ at higher temperatures, thereby increasing the width of the acceptable process window.

Figure 7:
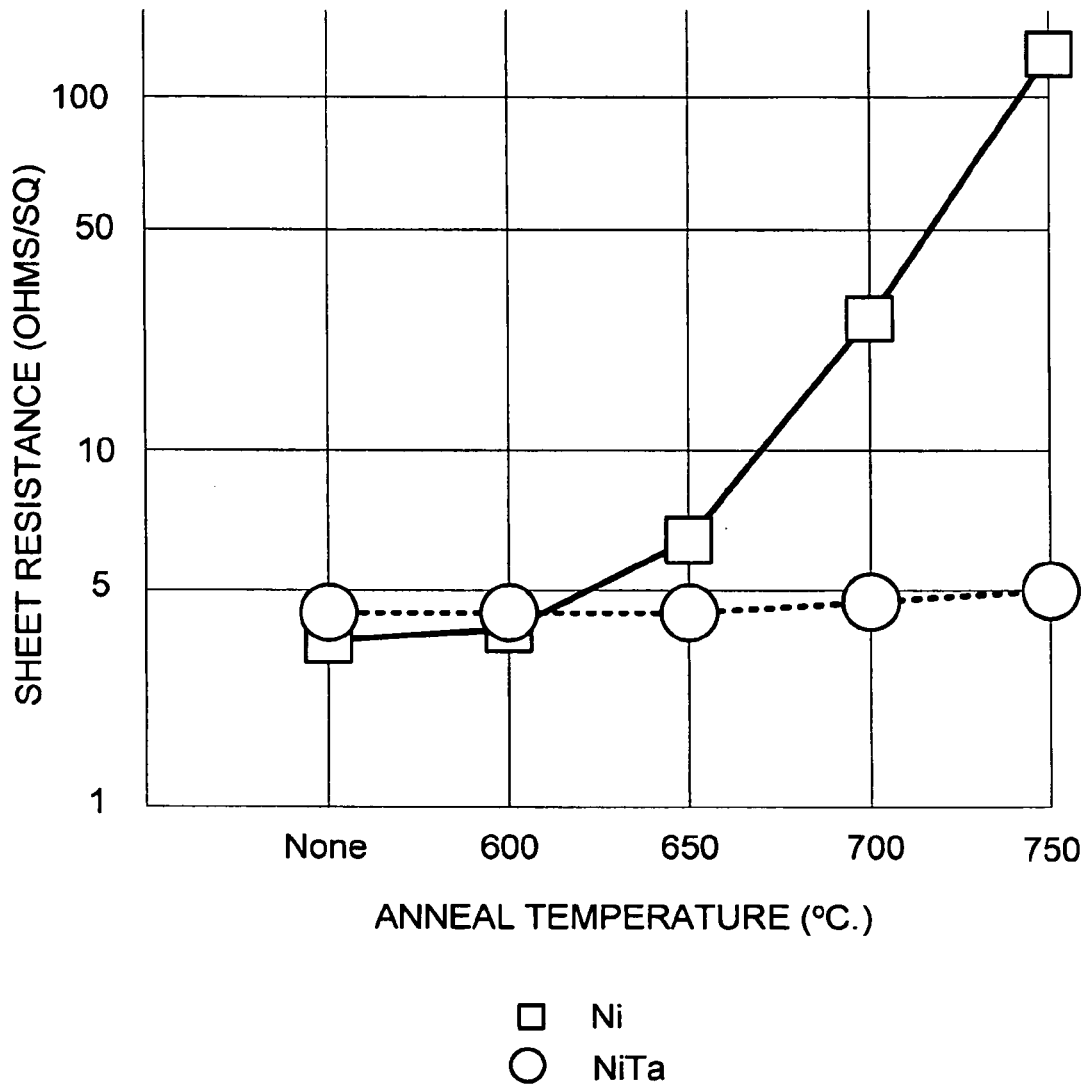
FIG. 7 is a graph illustrating the sheet resistance of silicide layers exposed to additional annealing as a function of the metal layer composition and the annealing temperature.

Tests were conducted to evaluate the impact of the tantalum on the stability of the resulting silicides using Ni and NiTa (3.5 atomic percent Ta) films deposited on single crystal silicon. After the initial formation of a standard silicide layer, the test wafers were annealed for an additional 5 minutes using a range of annealing temperatures. As reflected in the data presented in FIG. 7, the silicide films prepared from the NiTa alloy and subjected to the longer anneal again exhibited a slower rate of increase in the sheet resistance of the silicide layer than those prepared from Ni alone, again suggesting that the tantalum retards the phase transition from NiSi to NiSi$_2$, thereby producing a more stable silicide film. This more stable silicide film will, in turn, allow a wider range of post-silicide processes without undue increases in the sheet resistance of the silicide film.

Figure 8:
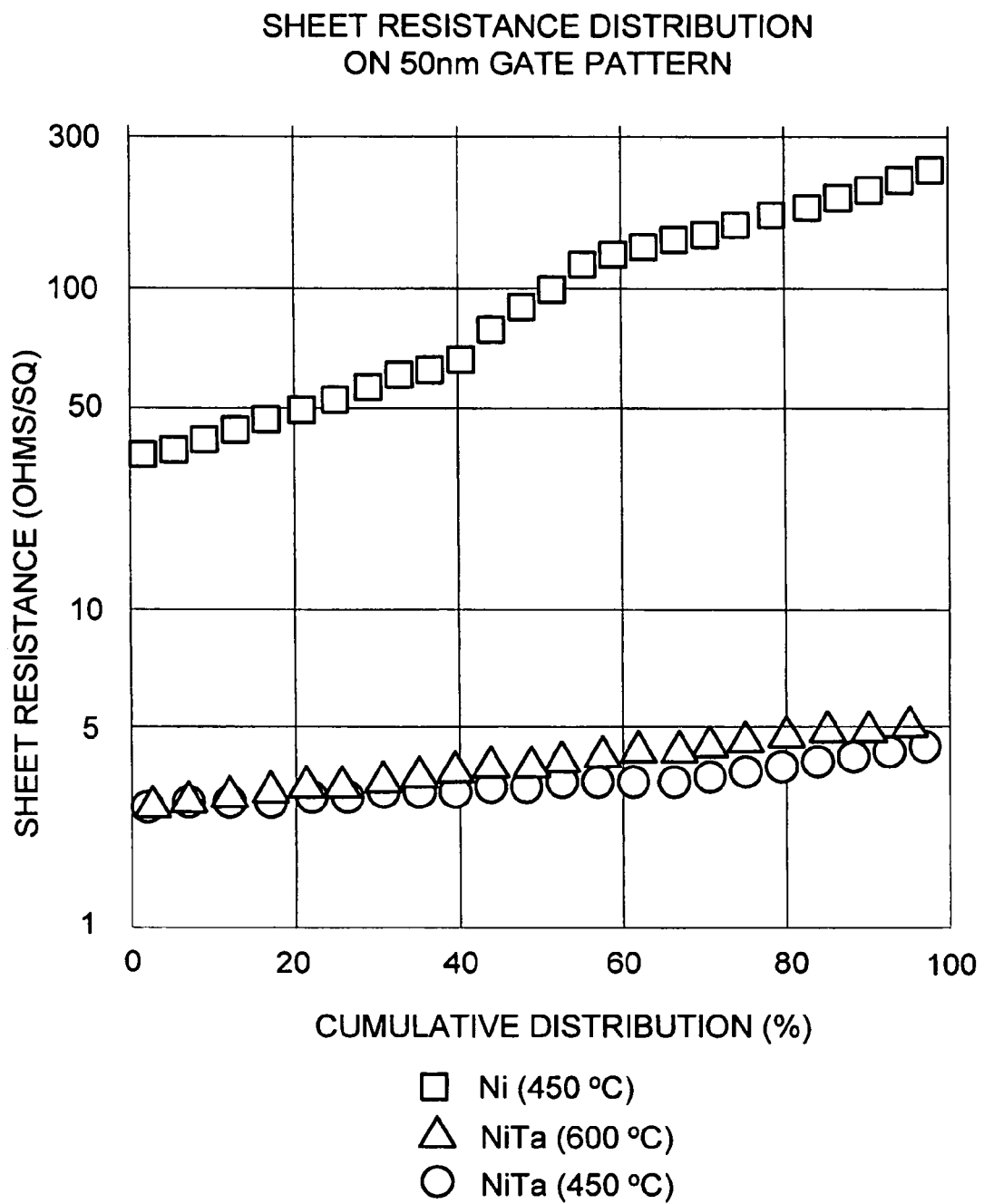
FIG. 8 is a graph illustrating the cumulative measurement of sheet resistance measured on a 50 nm gate pattern as a function of the metal layer composition and the formation temperature.

The improved thermal stability of silicides formed from nickel alloyed with a refractory metal, specifically tantalum is illustrated in FIG. 8. The cumulative sheet resistance data presented in FIG. 8 illustrates that a minor portion of tantalum included in a nickel alloy produces a silicide having both a lower initial sheet resistance than a silicide prepared from substantially pure nickel at the same temperature (450° C.). The data presented in FIG. 8 also demonstrates an improvement in thermal stability provided by the inclusion of a minor portion of a refractory metal that permits operation at temperatures as high as 600° C. while still maintaining a lower and more uniform sheet resistance, about 4–5 Ω/square, in contrast to the higher and more varied sheet resistance, about 30 250 Ω/square, of the silicide produced at 450° C. with unalloyed nickel.

Figure 3:
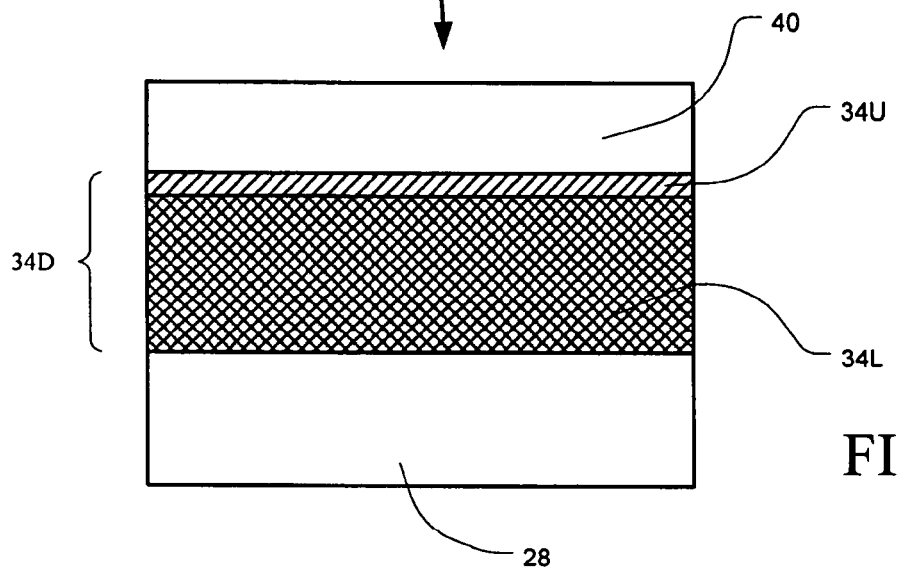
FIG. 3 is an enlarged illustration of a portion of the silicide structure from FIG. 2G.
Figure 10:
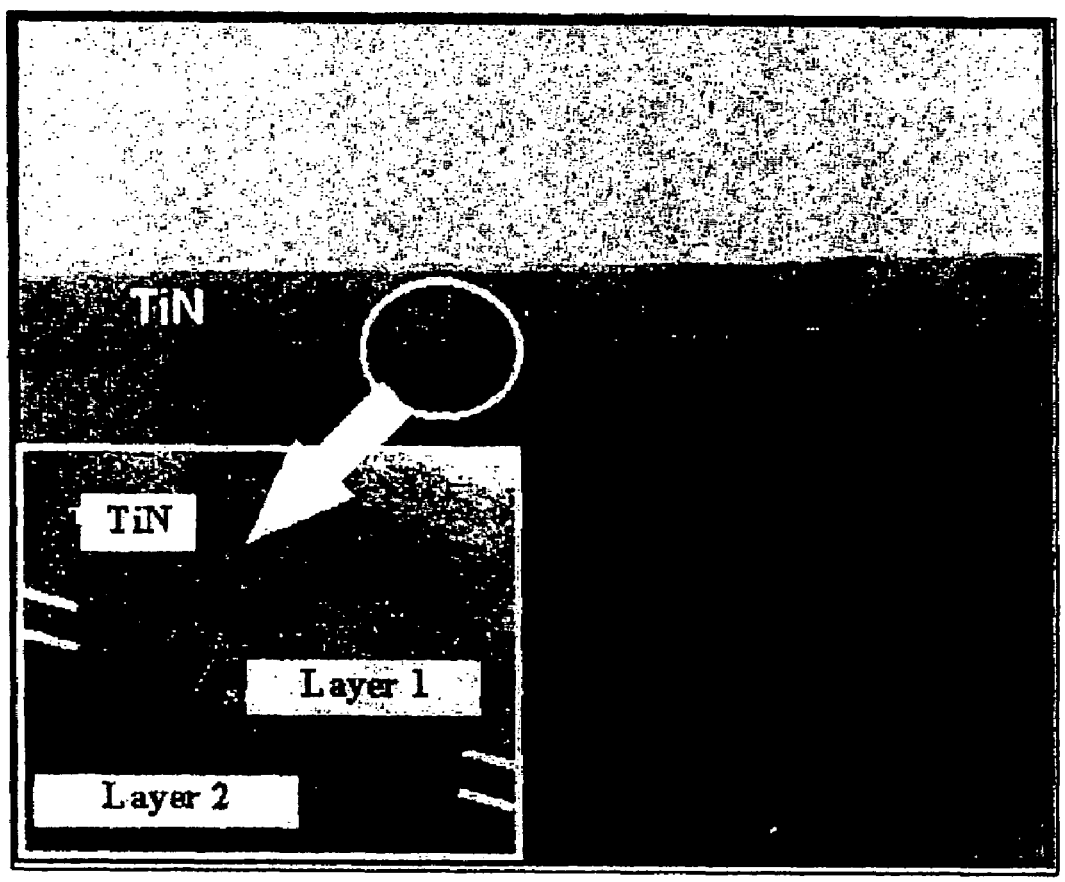
FIG. 10 is a TEM micrograph illustrating the formation of the two layer structure These drawings are provided to assist in the understanding of the exemplary embodiments of the invention as described in more detail below and should not be construed as unduly limiting the invention. The relative spacing, sizing and dimensions of the various elements illustrated in the drawing are not drawn to scale and may have been exaggerated, reduced or otherwise modified for the purpose of improved clarity. Those of ordinary skill in the art will also appreciate that certain layers that may be commonly utilized in the manufacture of semiconductor devices including, for example, photoresist patterns and multilayer metallization structures, have been omitted simply to improve clarity and reduce the number of drawings.

Transmission electron microscopy (TEM) and Rutherford backscattering spectroscopy (RBS) were also utilized to evaluate the silicide films produced using NiTa alloys. The TEM evaluation indicated the presence of two distinct layers or regions within in the silicide film. As illustrated in FIG. 3, the silicide film 34D formed according to the exemplary embodiments of the invention includes both a thicker lower layer 34L and a thinner upper layer 34U. A TEM micrograph illustrating the formation of the thinner upper layer and the thicker lower layer under the TiN capping layer is reproduced as FIG. 10.

Figure 9:
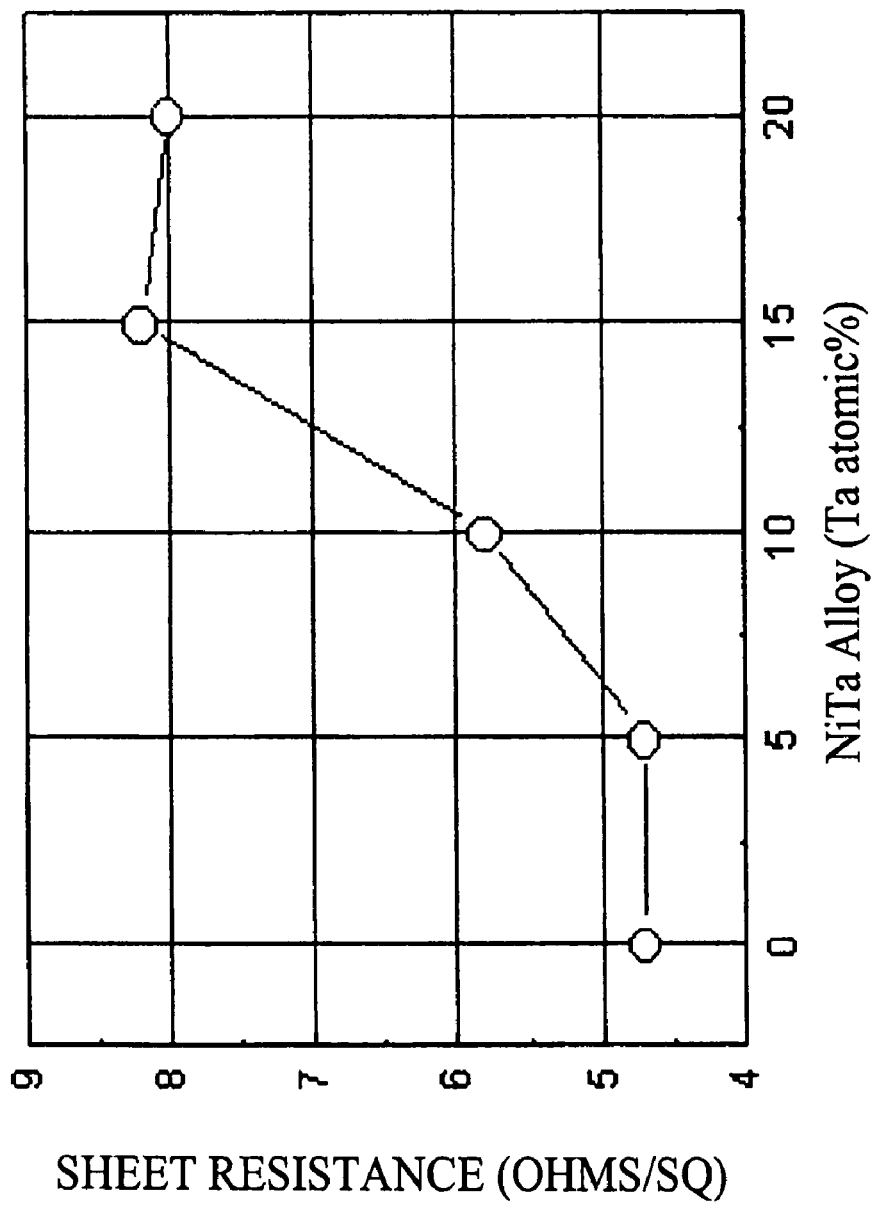
FIG. 9 is a graph illustrating the sheet resistance of the resulting silicide as a function of the tantalum concentration.

It is believed that the two layers observed are produced as the result of the higher diffusivity of the nickel component of the alloy which leads to a segregation or accumulation of the alloying metal(s) in the upper layer as the nickel diffuses into and reacts with the silicon. As illustrated in FIG. 9, tests have shown that higher concentrations of Ta in the nickel alloy can actually increase the sheet resistance of the resulting silicide layer. Consequently, it is believed that better results will be achieved when the alloying metal(s) are present in the nickel alloy an amount of no more than about 10 atomic percent and generally less than about 5 atomic percent.

Additional analysis of the two layers using RBS, including Rutherford Universal Manipulation Program (RUMP) simulations of the RBS spectra, indicated that the two layers had significantly different tantalum contents that varied with the amount of tantalum included in the initial Ni alloy.

A series of nickel silicides was prepared from a series of 130 Å layers of nickel alloys having tantalum concentrations of 3.5, 5.0 and 10.0 atomic percent respectively that had been deposited directly via sputtering on silicon substrates. The coated substrates were then annealed at 450° C. for 30 seconds to form exemplary nickel silicides according to the invention. The upper and lower layers of the nickel silicides were then evaluated with respect to composition and thickness. The composition and thickness data is reflected below in Table 2.

TABLE 2

| Property | Upper Layer | | | Lower Layer | | |
| --- | --- | --- | --- | --- | --- | --- |
| Alloy Ta Content (at %) | 3.5 | 5.0 | 10.0 | 3.5 | 5.0 | 10.0 |
| Ni (at %) | 60 | 30 | 1 | 48 | 50 | 50 |
| Ta (at %) | 12 | 54 | 98 | 0.1 | 0.2 | 0.2 |
| Si (at %) | 28 | 16 | 1 | 51.9 | 49.8 | 49.8 |
| Thickness (Å) | 39 | 33 | 40 | 320 | 420 | 435 |

As reflected in the data presented in TABLE 2, regardless of the concentration of Ta included in the nickel alloy, even at 10 atomic percent the majority of the tantalum remained in the thin, approximately 30–40 Å, upper layer. Conversely, the nickel migrated into the underlying silicon to form a relatively thick, approximately 320–440 Å, lower layer where it was present in approximately a 1:1 ratio with silicon, indicating the prevalence of the preferred NiSi formulation.

As also reflected in the data presented in TABLE 2, the concentration of nickel remaining in the upper layer varies widely with lower concentrations of tantalum in the initial alloy being reflected in nickel concentrations as high as 98 atomic percent and tantalum concentrations as low as 12 atomic percent for a nickel alloy having 3.5 atomic percent tantalum. It is anticipated that nickel alloys having even lower tantalum concentrations would continue this trend with the nickel concentration increasing and the tantalum concentration decreasing in the upper layer.

Depending on the particular alloy selected and the silicidation process utilized, it is expected that the tantalum concentration in the upper layer may range from about 5 to above 95 atomic percent. Conversely, it is expected that the tantalum concentration in the lower layer will remain below about 4.9 atomic percent even with relatively high tantalum concentrations in the initial alloy.

In light of this data, a region having a tantalum concentration of more than 4.9 atomic percent would generally be considered to be an upper layer and may be used to designate the boundary between the upper and lower layers. Also as reflected in the data presented in TABLE 2, the upper layer tends to be significantly thinner than the lower layer and will generally represent no more than about 30 percent of the thickness of the entire silicide layer. Conversely, the tantalum-poor lower layer will tend to represent at least about 70 percent of the thickness of the entire silicide layer.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A method of forming a nickel silicide layer on an exposed silicon surface comprising:
   depositing a nickel alloy layer on the exposed silicon surface, the nickel alloy including nickel and an alloying metal that constitutes no more than about 10 atomic percent of the nickel alloy; and
   reacting the nickel alloy layer with the exposed silicon surface to form a nickel silicide layer having an upper layer and a lower layer, wherein the alloying metal is preferentially segregated in the upper layer.

2. A method of forming a nickel silicide layer according to claim 1, wherein:
   the lower layer includes at least 95 atomic percent nickel and silicon.

3. A method of forming a nickel silicide layer according to claim 2, wherein:
   the lower layer includes at least 99 atomic percent nickel and silicon.

4. A method of forming a nickel silicide layer according to claim 3, wherein:
   the nickel and silicon are present in the lower layer in an atomic ratio of about 1.

5. A method of forming a nickel silicide layer according to claim 1, further comprising:
   forming a capping layer on the nickel alloy layer before reacting the nickel alloy with the exposed silicon.

6. A method of forming a nickel silicide layer according to claim 5, wherein: the capping layer includes a major portion of titanium nitride.

7. A method of forming a nickel silicide layer according to claim 1, wherein: the alloying metal is at least one metal selected from a group consisting of tantalum, vanadium, zirconium, hafnium, tungsten, cobalt, platinum, chromium, palladium, niobium and combinations thereof.

8. A method of forming a nickel silicide layer according to claim 1, wherein:
   the alloying metal is tantalum and is present in a concentration of at least about 0.1 atomic percent of the nickel alloy.

9. A method of forming a nickel silicide layer according to claim 8, wherein:
   the nickel alloy consists essentially of nickel and tantalum, the tantalum being present in an amount between about 0.1 and about 5 atomic percent.

10. A method of forming a nickel silicide layer according to claim 5, wherein: the capping layer has a nitrogen:titanium atomic ratio of at least about 0.5.

11. A method of forming a nickel silicide layer according to claim 6, wherein: the lower layer has a first thickness; and
   the upper layer has a second thickness, wherein the first thickness is at least 70% of a sum of the first thickness and the second thickness.

12. A method of forming a nickel silicide layer according to claim 6, wherein: the lower layer has a first thickness; and
   the upper layer has a second thickness, wherein the first thickness is at least 85% of a sum of the first thickness and the second thickness.

13. A method of forming a nickel silicide layer according to claim 12, wherein: the lower layer has a tantalum concentration no greater than about 4.9 atomic percent; and
   the upper layer has a tantalum concentration of at least about 5 atomic percent.

14. A method of forming a nickel silicide layer according to claim 12, wherein: the lower layer has a tantalum concentration no greater than about 0.5 atomic percent; and
   the upper layer has a tantalum concentration no greater than about 60 percent.

15. A method of manufacturing a semiconductor device comprising: defining an active region on a semiconductor substrate; forming a gate electrode in the active region;
   exposing a silicon surface on the semiconductor substrate;
   forming a nickel alloy layer on the semiconductor substrate, the nickel alloy including nickel and an alloying metal that constitutes no more than about 10 atomic percent of the nickel alloy;
   reacting a portion of the nickel alloy layer with the exposed silicon surface to form a nickel silicide region; and
   removing an unreacted portion of nickel alloy layer from the semiconductor substrate;
   wherein the nickel silicide region includes an upper layer and a lower layer, and further wherein the alloying metal is preferentially segregated into the upper layer.

16. A method of manufacturing a semiconductor device according to claim 15, wherein:
   nickel and silicon represent at least about 95 atomic percent of the lower layer of the nickel silicide region.

17. A method of manufacturing a semiconductor device according to claim 16, wherein:
   nickel and silicon represent at least about 99 atomic percent of the lower layer of the nickel silicide region.

18. A method of manufacturing a semiconductor device according to claim 15, wherein:
   the lower layer of the nickel silicide region includes nickel atoms and silicon atoms in a ratio of between about 9:10 and 10:9.

19. A method of manufacturing a semiconductor device according to claim 15, further comprising:
   forming a capping layer on the nickel alloy layer;
   maintaining the capping layer until the nickel silicide region has been formed; and removing the capping layer.

20. A method of manufacturing a semiconductor device according to claim 18, wherein:

the capping layer includes a major portion of TiN.

21. A method of manufacturing a semiconductor device according to claim 15, wherein exposing the silicon surface on the semiconductor substrate includes:

exposing portions of the semiconductor substrate in a source/drain region formed in the active region.

22. A method of manufacturing a semiconductor device according to claim 15, further comprising:

forming a gate capping layer on the gate electrode to protect an upper surface of a polysilicon layer included in the gate electrode.

23. A method of manufacturing a semiconductor device according to claim 15, wherein exposing silicon surfaces on the semiconductor substrate includes:

exposing silicon surfaces only on the gate electrode.

24. A method of manufacturing a semiconductor device according to claim 23, further comprising:

forming an insulating layer on the semiconductor substrate and the gate electrode; and removing an upper portion of the insulating layer to expose a silicon surface on the gate electrode with a lower portion of the insulating layer covering source/drain regions formed in the active region.

25. A method of manufacturing a semiconductor device according to claim 15, wherein exposing silicon surfaces on the semiconductor substrate includes:

exposing silicon surfaces in source/drain regions formed in the active region; and exposing a silicon surface on the gate electrode.

26. A method of manufacturing a semiconductor device according to claim 15, wherein:

the alloying metal is at least one metal selected from a group consisting of tantalum, vanadium, zirconium, hafnium, tungsten, cobalt, platinum, chromium, palladium, niobium and combinations thereof.

27. A method of manufacturing a semiconductor device according to claim 26, further comprising:

forming a capping layer on the nickel alloy layer;

maintaining the capping layer until the nickel silicide region has been formed; and removing the capping layer.

28. A method of manufacturing a semiconductor device according to claim 15, wherein:

the alloying metal consists essentially of tantalum.

29. A method of manufacturing a semiconductor device according to claim 28, wherein:

tantalum constitutes no more than about 5 atomic percent of the nickel alloy.

30. A method of manufacturing a semiconductor device according to claim 15, wherein reacting the nickel alloy with the exposed silicon surfaces to form nickel silicide regions on the semiconductor substrate includes:

heating the substrate and the nickel alloy layer to a temperature between about 250° C. and about 550° C. for a silicidation period of between about 10 seconds and about 30 minutes.

31. A method of manufacturing a semiconductor device according to claim 15, further comprising:

completing the manufacture of the semiconductor device utilizing processes such that at least about 90 percent of the nickel silicide region remains nickel monosilicide, NiSi.

32. A method of manufacturing a semiconductor device according to claim 31, wherein:

the nickel silicide region contains substantially no nickel disilicide, $NiSi_2$.

33. A method of manufacturing a semiconductor device according to claim 15, wherein:

the lower layer has a first thickness;

the upper layer has a second thickness; and the first thickness is at least 70% of a sum of the first thickness and the second thickness.

34. A method of manufacturing a semiconductor device according to claim 15, wherein:

the lower layer has a first thickness;

the upper layer has a second thickness; and the first thickness is at least 85% of a sum of the first thickness and the second thickness.

* * * * *